United States Patent [19]

Kushibiki et al.

[11] Patent Number: 4,908,285
[45] Date of Patent: Mar. 13, 1990

[54] HOLOGRAM MEMBER

[75] Inventors: Nobuo Kushibiki, Yamato; Yoko Yoshinaga, Machida; Naosato Taniguchi, Atsugi; Tetsuro Kuwayama, Yokohama, all of Japan

[73] Assignee: Canon Kabushiki Kaisha, Tokyo, Japan

[21] Appl. No.: 194,172

[22] Filed: May 16, 1988

[30] Foreign Application Priority Data

| May 18, 1987 | [JP] | Japan | 62-118964 |
| May 18, 1987 | [JP] | Japan | 62-118965 |
| May 21, 1987 | [JP] | Japan | 62-122414 |
| May 21, 1987 | [JP] | Japan | 62-122415 |
| May 21, 1987 | [JP] | Japan | 62-122416 |
| May 21, 1987 | [JP] | Japan | 62-122417 |
| May 21, 1987 | [JP] | Japan | 62-122418 |

[51] Int. Cl.$^4$ .......... G03H 1/04; G03H 1/02; A61F 13/02
[52] U.S. Cl. .......... 430/1; 430/2; 430/252; 430/259; 156/233; 156/234; 156/240; 350/3.61; 350/3.6; 428/42; 428/41; 428/40
[58] Field of Search .......... 430/1, 2, 259, 252; 428/42, 41, 40; 350/3.61, 3.6; 156/233, 234, 240

[56] References Cited

U.S. PATENT DOCUMENTS

| 3,560,210 | 2/1971 | Grobin, Jr. .......... 350/3.6 X |
| 3,987,569 | 10/1976 | Chase .......... 428/41 X |
| 4,172,724 | 10/1979 | Matsumoto et al. .......... 430/2 X |
| 4,173,474 | 11/1979 | Tanaka et al. .......... 430/1 X |
| 4,201,441 | 1/1979 | Matsumoto et al. . |
| 4,258,111 | 5/1979 | Matsumoto et al. . |
| 4,285,999 | 8/1981 | Olivieri .......... 428/41 X |
| 4,287,277 | 5/1979 | Matsumoto et al. . |

FOREIGN PATENT DOCUMENTS 125823  2/1978  Japan .......... 430/259

OTHER PUBLICATIONS

"Volume Holography and Volume Gratings", by L. Solymar and D. J. Cooke, Dept. of Engineering Science, University of Oxford, Academic Press, 1981.

Primary Examiner—Paul R. Michl
Assistant Examiner—Cynthia Hamilton
Attorney, Agent, or Firm—Fitzpatrick, Cella, Harper & Scinto

[57] ABSTRACT

A hologram member is provided which comprises a substrate, and a film in which a volume type phase hologram is recorded. The film is provided peelably on the substrate. The substrate preferably has a light transmittance of 30% or more at a wavelength of from 450 to 800 nm. The film may comprise a vinylcarbazole.

36 Claims, 4 Drawing Sheets

HOLOGRAM MEMBER

BACKGROUND OF THE INVENTION

1. Field of the Invention

The present invention relates to a volume type phase hologram member with which a three-dimensional image can be viewed, for example, on a flat-sheet-like film, and more particularly to a hologram member with which a hologram can be simply and easily provided at a desired place by transfer.

2. Related Background Art

Holography is a technique by which an object is irradiated by a sufficiently coherent wave of light such as a laser beam where the wave is modulated in the amplitude and phase in accordance with the shape of the object, the modulated light reflected upon or transmitted through it is received on a photosensitive material and recorded, and a hologram thus formed is irradiated by light to reproduce an optical image of the object thereby recorded. Thus, a three-dimensional optical image can be viewed, for example, on a flat-sheet-like film.

With development of researches on such holography, at present time it has been made considerably clear what are required for the photosensitive materials (or recording materials). Known as the photosensitive materials usable in hologram formation are various materials including bleached silver salts, photoresists, thermoplastic resins, dichromate gelatin, inorganic glass materials, ferroelectric materials, etc., and researches are further being made on the suitability of the materials to the holography.

The properties which the photosensitive materials for use in forming a hologram should have can be enumerated, for example, as follows:

(1) a sensitivity to a laser beam, particularly to a laser beam of the visible wavelength region, and the sensitivity being high.
(2) a high resolving power;
(3) a high diffraction efficiency of hologram;
(4) a low noise level of hologram;
(5) a stability of hologram;
(6) easiness of recording and reproducing operations; etc.

On the other hand, with progress in holographic techniques, it is being made possible to form a hologram enduarable to practical use, and uses of holograms have expanded to various fields such that images themselves are enjoyed or holograms are used for decorating a variety of articles, and all sorts of corresponding forms are being required also in holograms.

For example, holograms of the type an uneven pattern corresponding to an image is formed on the surface of the photosensitive material and the image is reproduced by utilizing the light reflected upon or transmitted through the uneven pattern, have been already utilized as covers for books or as marks for preventing forgery or falsification of magnetic cards.

However, in regard to both the above-mentioned properties of the photosensitive materials for use in forming a hologram and the form of a hologram itself, the present state of things is such that there has been provided no hologram that can sufficiently answer the various demands accompanying the uses expanding as mentioned above.

For example, there has not been provided any technique of applying holograms to desired articles with simple operation and with ease, or any form of holograms suited therefor.

SUMMARY OF THE INVENTION

The present invention was made on account of how to cope with the various demands accompanying such expanding uses of holograms, and an object thereof is to provide a technique that makes it easy to apply holograms to all sorts of articles.

The present invention provides a hologram member comprising a substrate, and a film in which a volume type phase hologram is recorded, provided on said substrate in a peelable state.

DETAILED DESCRIPTION OF THE PREFERRED EMBODIMENTS

Using a transfer type hologram member of the present invention, a desired hologram can be applied to a desired site of all sorts of articles made of, for example, paper, metals, plastics, ceramics, etc. (hereinafter called "transferring medium") according to a simple operation that a hologram film held on a substrate is transferred to a desired article. It is also possible to use a suitable mounting sheet as the transferring medium to transfer the hologram film thereon and enjoy the transferred image like a picture or photograph.

Also, in the case of the type the uneven surface is used as previously mentioned, the uneven pattern formed on the surface may inevitably suffer deformation, break or the like when the hologram is directly bonded by contact bonding or adhesion on the various transferring medium. However, the transfer type hologram member of the present invention, which employs a volume type phase hologram film, may not bring about such a problem when transferred.

The present invention will be described below in detail with reference to the accompanying drawings.

Figure 1:
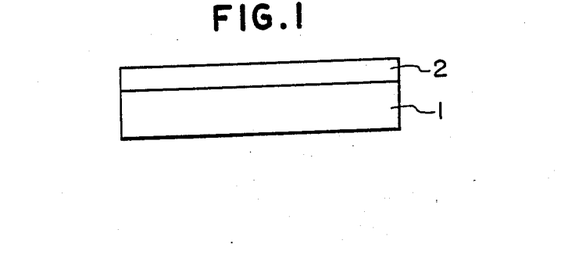
FIG. 1 to FIG. 4 are diagramatical side views illustrating typical examples of the constitution of hologram members of the present invention.

FIG. 1 is a diagramatical side view illustrating an example of the constitution of the transfer type hologram member of the present invention.

This transfer type hologram member is constituted of a substrate 1 and a hologram film 2 provided on the substrate 1 in a peelable state.

Used as the substrate 1 is a substrate having a light transmittance of 30% or more at the wavelength region of 400 nm and a light transmittance or 40% or more at the wavelength region of from 450 to 800 nm. Using such a substrate, the exposure for the formation of a hologram on the substrate can be carried out in a high sensitivity and high precision.

The above transmittance is a value measured according to the procedures described in ASTM D 1003, and here is used a substrate having a transmittance of 30% or more, preferably 50% or more, at 400 nm, and also having a transmittance of 40% or more, preferably 60% or more, at 450 to 800 nm.

In this occasion, ultraviolet absorbents and colorants may be mixed for the purpose of preventing deterioration by light, so long as the above conditions are not precluded.

Suitably used as the substrate 1 is a substrate having the strength enough to support the hologram film 2 and having the properties by which the operation to transfer the hologram film can be made with ease.

Substrates made of any materials can be also utilized as the substrate 1 so long as they satisfy such properties. Specifically, they may include those made of materials such as resins, metals and ceramics, and those having an appropriate flexibility are convenient as the hologram film 2 can be peeled with ease in the transfer operation.

In instances in which the transparent substrate used in this step is made to have a thickness larger than 0.2 mm, generally utilizable are materials substantially amorphous or materials substantially monocrystalline. On the other hand, in instances in which a transparent substrate having a thickness not larger than 0.2 mm (such a substrate is grouped into a film commonly so named), generally utilizable are not only those substantially amorphous but also those made transparent by drawing a substantially crystalline material in the biaxial direction when it is processed for forming, to cause orientation crystallization.

The substrate material that can be used for such purposes may include as the transparent substrate having a thickness more than 0.2 mm, for example, glass, or organic polymers such as polymethyl methacrylate, polycarbonate, polyarylate, polyether sulfone, polystyrene, poly(4-methylpentene), a styrene/acrylate or methacrylate copolymer, and an acrylic ester with polyhydric alcohol.

As for the transparent film, suitably used besides the above as films made transparent, comprising a crystalline polymer, are polyesters such as polyethylene terephthalate, polyethylene, polypropylene, polyvinyl chloride, polyvinylidene chloride such as Saran (trademark), polyethylene fluoride/propylene, polyvinylidene fluoride, polyacrylonitrile, pxolyvinylidene cyanide/vinyl acetate, polyether ether ketone, polyimides, polyamides, cellophane, polyvinyl alcohol, etc.

Thickness of the substrate may be appropriately selected depending on the quality of the substrate material used and within the range in which the properties as set out above can be satisfied. For example, in instances where the substrate made of resin is used, preferably used are substrates having a thickness of about 5 μm or more, and in instance where the transparent substrate made of resin is used, preferably used are those having a thickness usually of from about 10 μm to about 200 μm, preferably from 20 to 100 μm, to take, for example, even balance between the mechanical strength and transparency.

The surface of the hologram film 2 side of the substrate 1 may further optionally be applied with surface treatment as exemplified by an electrical discharge treatment using corona, plasma or the like, a physical treatment such as a flame treatment, a chemical treatment by sulfuric acid, nitric acid, a fluoride compound, an alkali, a silane compound, etc. to enhance the transfer performance of the hologram film 2 or control the lamination to the hologram film 2, and further to improve the suitability to a peel layer described later.

However, in the instance where the transparent substrate as described above is used as the substrate 1, these surface treatments may desirably be carried out so long as the optical properties as mentioned above, required in the transparent substrate, are not impaired.

As the hologram film 2, there can be used all sorts of volume type phase hologram films on which a desired image has been recorded.

In particular, suited for use in the transfer type hologram member of the present invention are volume type phase hologram films using a vinylcarbazole polymer as the photosensitive material, as being superior in the moisture resistance and storage stability of the resulting hologram itself and also being superior in the stability to the operations when the hologram is formed or the transfer is performed.

This vinylcarbazole polymer refers to a polyvinyl carbazole, an alkyl-substituted polyvinyl carbazole, a hologen-substituted polyvinyl carbazole, and polymers chiefly comprised of these, and one or more of these can be used as desired. Specifically, there can be utilized, for example, polyvinyl carbazole, a 3-chlorovinyl carbazole polymer, a 3-bromovinyl carbazole polymer, a 3-iodovinyl carbazole polymer, a 3-methylvinyl carbazole polymer, a 3-ethylvinyl carbazole polymer, a chlorinated polyvinyl carbazole, a brominated polyvinyl carbazole, etc.

In particular, suited for practical use is the unsubstituted polyvinyl carbazole, as being readily available and yet as being particularly superior in the performances of the resulting holograms.

The vinylcarbazole polymer may also be optionally copolymerized with other monomers for the purpose of controlling the properties such as strength or softness when formed into a film. Other monomers usable in such purpose may include, for example, in addition to the above vinylcarbazoles, vinyl monomers copolymerizable by radical polymerization, including vinyl esters such as vinyl acetate, esters of acrylic acid and methacrylic acid, styrene and styrene derivatives, etc. For such a purpose, other polymers as exemplified by polystyrene, a styrene/hydrogenated butadiene copolymer, a styrene/butadiene hydride copolymer can also be used by blending so long as a holographic image can be recorded.

These are used by selecting the proportion of addition so that the desired properties can be obtained.

This vinylcarbazole polymer is used in the hologram formation in the state that it has been activated with radiation by use of an iodine compound.

Used as this iodine compound are compounds capable of coexisting in a polymer component to constitute a photosensitive material layer having a sufficient sensitivity to the visible light wavelength, as exemplified by carbon tetraiodide, iodoform, ethylene tetraiodide, triiodoethane, tetraiodoethane, pentaiodoethane, hexaiodoethane, etc.

In the photosensitive material layer comprising the vinylcarbazole polymer in this manner, the volume type phase hologram having a high-resolution and high diffraction efficiency can be formed by employing a method in which an interference pattern is exposed to light using two beams of coherent light from a laser, comprising the object beam and the reference beam having a sensitivity to visible light up to 560 nm and having a suitable wavelength within such a wavelength region, and thereafter, according to a method as disclosed in U.S. Pat. No. 4,287,277, subjected to a development step utilizing the swelling and shrinking phenomena by using solvents.

The thickness of the hologram film is preferably in the range of from 4 to 20 μm, more preferably from 4 to 15 μm.

The hologram film used in the present invention may require no limitation in its material or the method of recording the image, and thus may be comprised of any material and may be formed by any recording method.

To provide the hologram film 2 on the substrate 1, there can be utilized, for example, a method in which, using a hologram film in which a desired image has been already recorded, this film is laminated peelably on the substrate 1, or a method in which, using as the substrate 1 the transparent substrate previously described, a photosensitive material layer for use in forming a hologram is laminated on that transparent substrate in a peelable state, and then prescribed exposure to light and development processing are carried out. The present invention can be particularly effectively constituted in respect of the type the hologram is formed on the substrate.

In the transfer type hologram member having such constitution, the exposed surface of the hologram film 2 is overlapped on the surface of the transferring medium to which the hologram is to be transferred and these are pressed, so that the hologram film 2 can be transferred on other desired transferring medium.

What is meant by "peelable" referred to in the present invention is that in the above transfer operation the hologram film 2 can be separated from the substrate 1 without causing any change in its shape or the recording state of the image.

Accordingly, as the substrate 1 and hologram film 2, the respective materials should be selected in such combination that good transfer operations can be made.

Figure 2:
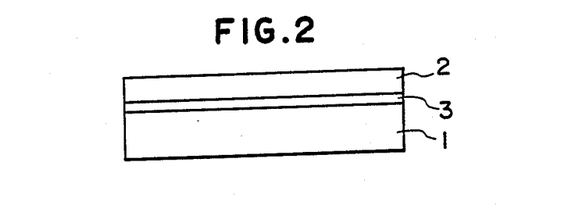

However, if in the constitution as shown in FIG. 1 the hologram film 2 cannot easily be peeled from the substrate 1, or combination of the hologram film with a substrate 1 is such that the hologram film 2 has too small thickness and too small strength to make a good transfer operation, a peel layer 3 may be provided between the substrate 1 and hologram film 2, for example, as shown in FIG. 2, whereby the good transfer operation can be achieved.

The peel layer 3 for such a purpose should preferably be made of a material with layer thickness which gives the function of making ready the peeling between the substrate 1 and hologram film 2.

The peel layer 3 may be of the type that it remains on the substrate 1 side after transfer operation, or the type that it comes into close contact with the hologram film 2 and is transferred together therewith.

As the peel layer 3 used for such a purpose is, for example, a layer comprised, for example, of a polymer, having a surface tension differing from the surface tension of the hologram film 2 (30 to 35 dyne/cm when the vinylcarbazole polymer is used) in an extend to give a satisfactory peeling state, or a layer comprised of a low-molecular surface improver called a silane coupling agent or titanium coupling agent.

Materials that can constitute the peel layer 3 may specifically include, for example, polymers such as polyvinyl alcohol, polyvinyl pyrrolidone, polyethylene fluoride-propylene and polyorganosiloxane; silane coupling agents such as gamma-glycidoxypropyl trimethoxysilane and vinyl trimethoxysilane; titanium coupling agents such as isopropyltristearoyl titanate and isopropyltrioctyl titanate; etc.

However, in the instance where the peel layer 3 is transferred together with the hologram film 2 and this peel layer 3 remain unremoved on the hologram film 2 after the transfer operation, the peel layer 3 is required to have no particular absorption band at the wavelength of from 400 to 800 nm so as not to obstruct the viewing of the hologram film 2.

In the instance where the peel layer of the type which remains unremoved on the hologram film 2 is used, said peel layer may be constituted of a material that functions as a protective layer of the hologram film, or various additives capable of imparting a protective function to the peel layer may be added to impart a function as a protective layer to the peel layer 3, so that the hologram film having been transferred can be automatically provided with the protective layer.

Materials for forming the peel layer and capable of functioning also as the protective layer may include, for example, polyethylene terephthalate, polyether ether ketone, polyperfluoroethylenepropylene, polyvinylidene fluoride, polyvinyl alcohol, etc.

The additives that can be added to impart the function as the protective layer may include, for example, triazole derivatives such as 2-(hydroxyphenyl)benzotriazole, triazine derivatives such as 1,3,5-tris(2'-hydroxyphenyl)triazine, benzophenone derivatives such as resorcyl monobenzoate, etc.

In the instance where the transparent substrate is used as the substrate 1 for the purpose as mentioned above, the peel layer 3 is required to have also the same transparency as in substrate 1.

The peel layer 3 can be provided by laminating, for example, the layer comprised of the above polymer on the substrate 1, or treating the surface of the substrate 1 with a solution containing the silane coupling agent or titanium coupling agent.

Figure 3:
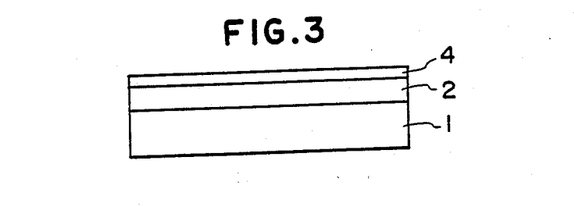

On the other hand, the exposed surface of the hologram film 2 may be provided with a layer 4 for adhesion or sticking as shown in FIG. 3 for the purpose of improving the transfer operability or for the purpose of improving the fixability of the hologram film on the transferring medium after transfer.

Materials usable in the layer 4 may be used by making selection from materials that can obtain satisfactory adhering or sticking effect, moreover may not adversely affect the hologram film 2 during the adhesion or sticking step utilizing said layer, and also may not chemically or physically react by themselves with the hologram film 2 to give any damage thereto, depending on the constitution of a desired transfer type hologram member.

For example, they can be used by selecting those satisfying the properties as mentioned above, from acrylate polymers, vinyl acetate polymers, alphacyanoacrylates, urethane type adhesives, rubber type adhesives, epoxy type adhesives, etc. In instances where a polyester copolymer is used, it can be used by making selection since the copolymerization composition for acrylate such as butyl acrylate and 2-ethylhexyl acrylate, and ethylene is appropriately altered and thereby its properties have been controlled depending on object articles so that the desired effect can be obtained.

The layer 4 may also optionally be pretreated by use of a primer.

Any type of adhesive or sticking agent may be available so long as it is effective, as exemplified by one-liquid types, two-liquid types, aqueous latex types, oily latex types, hot-melt types (powdery or sheet-like), heat-sealing types, etc.

To provide the layer 4, there may be used a method in which it is directly coated on the hologram film 2 (or a recording material for use in forming a hologram), a method in which a product once formed into a film by casting is adhered or sticked on the hologram film 2, or the like method by making appropriate selection depending on its form.

In instances where the layer 4 is provided as an adhesive layer, suitably usable is an adhesive layer capable of adhesion under the conditions of 100° to 120° C. and several kg/cm$^2$.

The adhesion or sticking strength of the layer 4 may be satisfactory if it is about 200 g/25 mm or more.

In instances where the transparent substrate is used for the purpose as mentioned above and further the layer 4 is previously provided on the recording material for use in forming a hologram before the exposure processing, the layer 4 is also further required to have the same transparency as in the transparent substrate, but not necessarily be required to do so if the layer 4 is provided on the hologram film 2 formed after the light exposure and development processing.

Figure 4:
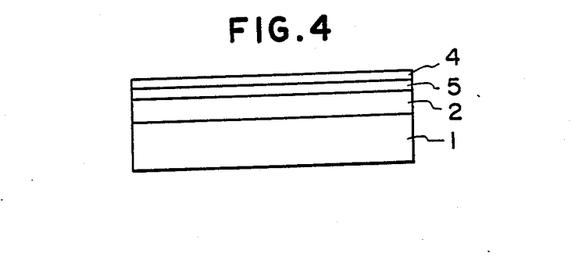

The transfer type hologram member of the present invention may also be provided with a layer 5 comprising a metal or a metal oxide on the exposed surface of the hologram film 2 as shown in FIG. 4.

The layer 5 is a layer that will constitute a background of the image viewed on the film when the hologram film 2 has been transferred onto the transferring medium. A holographic image can be made clearer and more attractive by appropriately selecting its material, color, shape, layer thickness and the position at which it is provided.

In particular, in the case when the transferring medium has a color that may damage the image viewed on the hologram film, this layer may be made opaque, thus making possible observation of the image in a good state.

The layer 5 used for such a purpose can be provided by laminating it on a given part of the top surface of the hologram film 2 according to a vapor deposition method with a thickness of approximately from 50 angstroms to 5,000 angstroms and with use of, for example, one or more of InO, Al$_2$O$_3$, Al, An, etc.

EXAMPLES

The present invention will be described below in greater detail by giving Examples.

EXAMPLE 1

Figure 5:
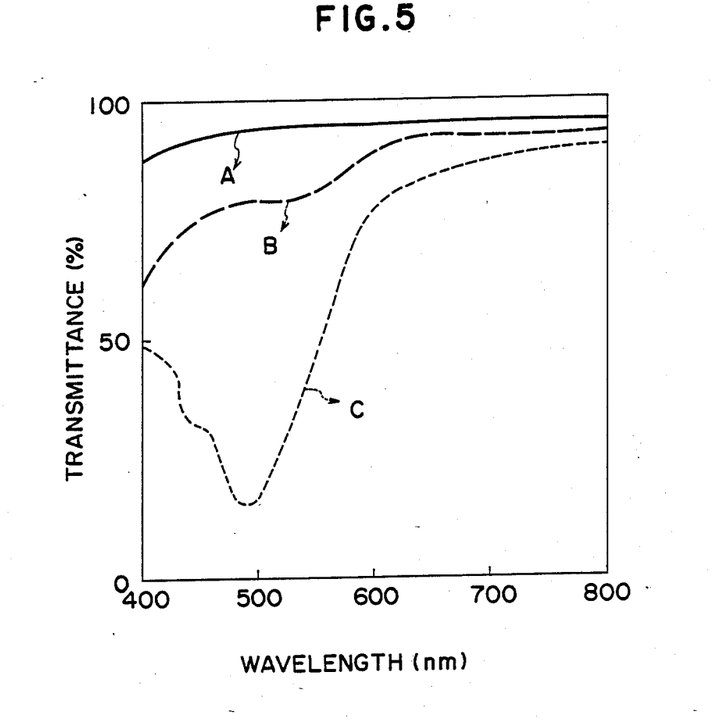
FIG. 5 to FIG. 7 are graphs showing absorption or reflection spectra of holograms and substrates used in Examples and Comparative Examples.

A light absorption spectrum of a polyether ether ketone film of 50 μm thick (Espex-K, available from Sumitomo Chemical Co., Ltd.) was measured to obtain the result as shown by curve A in FIG. 5.

On the above film, a solution obtained by dissolving 2.5 g of poly(N-vinylcarbazole) and 0.2 g of carbon tetraiodide in 30 g of monochlorobenzene was coated in a dark place by means of a spinner (Mikasa Spinner, 1H-2), followed by drying to obtain a hologram-forming photosensitive material layer of 5.0 μm in layer thickness.

The absorbance of the resulting photosensitive material layer was measured by a spectrophotometer UVIDEC-650 (available from Nippon Bunko K.K.) to have found that it had an absorption edge up to 560 nm.

In this photosensitive material layer, an image corresponding to a desired article was recorded according to the Denisyuk's method using an argon laser (514.5 nm) and under the condition of the light intensity ratio of 1:1 (the sum of light intensities of the both beams was 15 mJ/cm$^2$ right before incidence of light).

After exposure to light, the photosensitive material layer was successively processed according to the following steps (1) to (3) to obtain a transfer type hologram member of the present invention wherein a Lippman type reflection type hologram film in which a desired image had been recorded was provided on the substrate in a peelable state.

(1) Dipped in toluene for 2 minutes at 20° C.
(2) Dipped in xylene for 3 minutes at 30° C.
(3) Dipped in n-heptane for 3 minutes at 25° C., followed by drying.

The resulting hologram was of volume phase type, having a apatial frequency of about 3,000 mm$^{-1}$ to the light having a wavelength of 514.5 nm, a diffraction efficiency of 88%, and a transmittance of 90%.

The transfer type hologram member thus obtained was overlapped through its hologram film surface on a transferring medium comprising a sheet of Kent paper coated with Polysol AB-412BN (available from Showa Highpolymer Co., Ltd.), and a pressure of about 2 kg/cm$^2$ was applied by means of a roller, whereupon it was able to transfer the hologram film on the Kent paper.

There was no change in the properties of the transferred hologram as compared with those possessed immediately after its formation, and a good holographic image could be observed.

EXAMPLE 2

An absorption spectrum of a polyester film mixed with 5% of acetobenzene is shown by curve B in FIG. 5.

Example 1 was repeated to prepare a transfer type hologram member, except that the above film was used in place of the polyether ether ketone film used in Example 1.

The resulting hologram had a diffraction efficiency of 85%, and there were obtained almost the same properties as in Example 1.

Comparative Example 1

In 50 ml of water, 5 g of polyvinyl alcohol and 0.25 g of a ruthenium (III) trisbipyridyl complex were dissolved, followed by casting to prepare a film of about 100 μm thick, and its absorption spectrum was measured to obtain the result shown by curve C in FIG. 5. This film shows a very low transmittance at a wavelength region of around 450 to 500 nm.

Example 1 was repeated to prepare a transfer type hologram member, except that the above film was used in place of the polyether ether ketone film used in Example 1.

The resulting hologram had a diffraction efficiency of 25% and not sufficient image was obtained due to insufficient light exposition.

EXAMPLE 3

Figure 6:
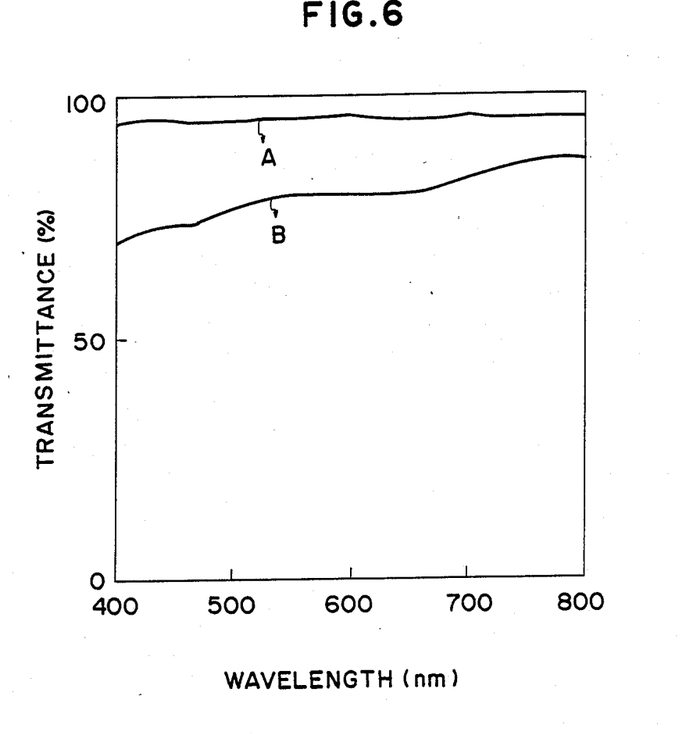

On a polyethylene terephthalate film of 50 μm thick as a substrate, polyvinyl alcohol having a polymerization degree of 1,200 (saponification degree: 86%) was coated to have a thickness of 5 μm as a peel layer. The transmittance of the laminated body thus obtained was measured by a spectrophotometer UVIDEC-650 to obtain the result shown by curve A in FIG. 6.

On the above laminated body, a solution obtained by dissolving 2.5 g of poly(N-vinylcarbazole) and 0.2 g of carbon tetraiodide in 30 g of monochlorobenzene was coated in a dark place by means of a spinner (Mikasa Spinner, 1H-2), followed by drying to obtain a hologram-forming photosensitive material layer of 7 μm in layer thickness.

The absorbance of the resulting photosensitive material layer was measured by a spectrophotometer UVI-DEC-650 (available from Nippon Bunko) to have found that it had an absorption edge up to 560 nm.

This photosensitive material layer was subjected to exposure to light and development processing in the same manner as in Example 1.

The resulting hologram was of volume phase type, having a spatial frequency of about 3,000 mm$^{-1}$ to the light having a wavelength of 514.5 nm, a diffraction efficiency of 88%, and a transmittance of 90%.

The transfer type hologram member thus obtained, it was able to be transferred on the same kind of transferring medium comprising a sheet of Kent paper coated with Polysol AB-412BN as used in Example 1.

EXAMPLE 4

First, a glass substrate was washed, and thereafter the above glass substrate was thrown into a hermetically closed vessel filled with trimethylsilane gas to form a peel layer by the reaction between the glass substrate surface and the gas.

Example 3 was repeated except for using this substrate to obtain a volume type phase hologram member.

On the vinylcarbazole film surface of the hologram member for transfer thus obtained, indium-tin oxide (ITO) was sputtered to form a film having a surface resistance of 200 ohm/cm$^2$. The absorption spectrum thereof is shown by curve B in FIG. 6. This film was dipped in water and peeled to obtain a hologram film having an ITO film on its surface.

The hologram film thus obtained was overlapped through its hologram film surface on a transferring medium comprising a sheet of Kent paper coated with Polysole AB-412BN (available from Showa High Polymer Co., Ltd.), and a pressure of about 2 kg/cm$^2$ was applied by means of a roller, whereupon it was able to transfer the hologram film on the Kent paper.

There was no change in the properties of the transferred hologram as compared with those possessed immediately after its formation, and there was able to be viewed a good holographic image.

EXAMPLE 5

Polyethylene was press-molded under a pressure of 100 kg/cm$^2$ at 190° C. to prepare a sheet of 1 mm thick as a substrate. The reflection spectrum of this sheet was measured by a spectrophotometer (UV-365, available from Shimadzu Corp.) equipped with an integrating sphere reflection measurement unit to obtain the result shown by curve A in FIG. 7.

Next, a hologram-forming photosensitive material layer was formed on the glass sheet in the same manner as in Example 3, followed by exposure to light and development to obtain a volume type phase hologram.

The resulting hologram was of volume phase type, having a space frequency of about 3,000 mm$^{-1}$ to the light having a wavelength of 514.5 nm, a diffraction efficiency of 88%, and a transmittance of 90%. Its reflection spectrum is also shown by curve B in FIG. 7.

The above hologram member was dipped in water to peel a hologram film from the glass sheet.

Figure 7:
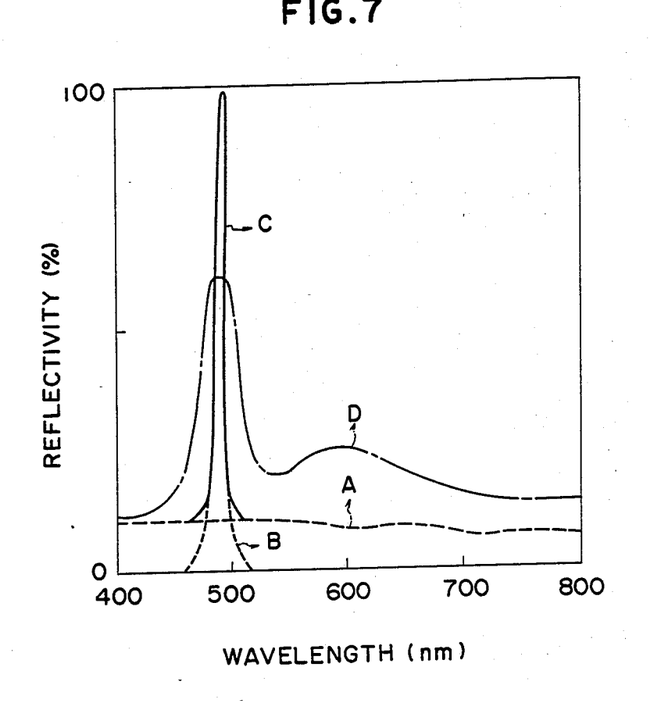

The resulting hologram film was laminated on the previously obtained polyethylene sheet (substrate), and its reflection spectrum was measured to obtain the result shown by curve C in FIG. 7. In this hologram, the color tone of the holographic image assuming a green color looked soft.

Next, Vinylol EA-300 (available from Showa High Polymer Co., Ltd.) was coated on the bottom surface of the substrate to have a dried film thickness of 5 μm.

The adhesion type hologram member thus obtained was overlapped through its adhesive layer on a stainless steel sheet, a pressure of 2 kg/cm$^2$ was applied at 50° C., and thus it was able to fix the hologram film on the stainless steel sheet.

There was no change in the properties of the fixed hologram as compared with those possessed immediately after its formation, and there was able to be viewed a good holographic image.

Comparative Example 2

Rhodamine B in an amount of 5% by weight was mixed in polyethylene, and the mixture was kneaded for 10 minutes at 250° C. by means of Laboplast Mill (available from Toyo Seiki K.K.), followed by pressing at 190° C. to prepare a sheet of 1 mm thick as a substrate.

Example 1 was repeated except for using the above substrate to prepare an adhesion type hologram, and its reflection spectrum was measured to obtain the result shown by curve D in FIG. 7. In the case of this hologram, the green-colored hologram assumed a reddish color tone, and was inferior in sharpness.

EXAMPLE 6

Polysole AB-412BN was coated on the bottom surface of the volume type phase hologram member obtained in Example 1.

The adhesion type hologram member thus obtained was able to be fixed on a black styrene/butyl acrylate copolymer sheet compounded with carbon black (5%).

There was no change in the properties and reflection spectrum of the fixed hologram as compared with those possessed immediately after its formation, and there was able to be viewed a good holographic image.

(Effect of the Invention)

The transfer type hologram member of the present invention has the constitution that hologram film is provided on a suitable substrate in a peelable state from the substrate, and a desired holographic image can be applied to a desired site of a desired article according to a simple operation that a hologram film held on a substrate is transferred to a desired article. It is also possible to use a suitable layout sheet as the transferring medium to transfer the hologram film thereon and enjoy the transferred image like a picture or photograph.

Also, in the case of the type the uneven surface is used as previously mentioned, the uneven pattern formed on the surface may inevitably suffer deformation, break or the like when the hologram is directly bonded by contact bonding or adhesion on the various transferring mediums. However, the transfer type hologram member of the present invention, which employs a volume type phase hologram film, may not bring about such a problem when transferred.

We claim:

1. A hologram member comprising a substrate and a film in which a volume type phase hologram is recorded, provided peelably on said substrate wherein said substrate has a thickness of from 5–200 μm.

2. The hologram member of claim 1, wherein said substrate has a thickness of from 20 to 100 μm.

3. A hologram member comprising a substrate and a film in which a volume type phase hologram is recorded, provided peelably on said substrate wherein said substrate comprises a crystalline resin.

4. A hologram member comprising a substrate and a film in which a volume type phase hologram is recorded, provided peelably on said substrate wherein said film is provided on said substrate with interposition of a peel layer.

5. The hologram member of claim 4, wherein said peel layer has no particular absorption band at a wavelength region of 400 to 800 nm.

6. A hologram member comprising a substrate and a film in which a volume type phase hologram is recorded, provided peelably on said substrate wherein a layer for adhesion or sticking is provided on the surface of said film on the reverse side to the substrate side.

7. A hologram member comprising a substrate and a film in which a volume type phase hologram is recorded, provided peelably on said substrate wherein a layer comprising one or more of a metal and a metal oxide is provided on the surface of said film on the reverse side to the substrate side.

8. The hologram member of claim 7, wherein said layer comprising one or more of a metal and a metal oxide has a thickness of from 50 to 5000 angstrom.

9. A hologram member comprising a substrate having a light transmittance of 30% or more at the wavelength region of 400 nm and 40% or more at a wavelength the region of from 450 to 800 nm, and a film in which volume type phase hologram is recorded, provided peelably on said substrate, wherein said substrate has a thickness of from 5-200 μm.

10. The hologram member of claim 9, wherein said substrate has a thickness of from 20 to 100 μm.

11. A hologram member comprising a substrate having a light transmittance of 30% or more at the wavelength region of 400 nm and 40% or more at a wavelength the region of from 450 to 800 nm, and a film in which volume type phase hologram is recorded, provided peelably on said substrate, wherein said substrate comprises a crystalline resin.

12. A hologram member comprising a substrate having a light transmittance of 30% or more at the wavelength region of 400 nm and 40% or more at a wavelength the region of from 450 to 800 nm, and a film in which volume type phase hologram is recorded, provided peelably on said substrate, wherein said film is provided on said substrate with interposition of a peel layer.

13. A hologram member comprising a substrate having a light transmittance of 30% or more at the wavelength region of 400 nm and 40% or more at a wavelength the region of from 450 to 800 nm, and a film in which volume type phase hologram is recorded, provided peelably on said substrate, wherein said substrate has no particular absorption band at a wavelength region of 400 to 800 nm.

14. A hologram member comprising a substrate having a light transmittance of 30% or more at the wavelength region of 400 nm and 40% or more at a wavelength the region of from 450 to 800 nm, and a film in which volume type phase hologram is recorded, provided peelably on said substrate, wherein a layer for adhesion or sticking is provided on the surface of said film on the reverse side to the substrate side.

15. A hologram member comprising a substrate having a light transmittance of 30% or more at the wavelength region of 400 nm and 40% or more at a wavelength the region of from 450 to 800 nm, and a film in which volume type phase hologram is recorded, provided peelably on said substrate, wherein a layer comprising one or more of a metal and a metal oxide is provided on the surface of said film on the reverse side to the substrate side.

16. The hologram member of claim 15, wherein said layer comprising one or more of a metal and a metal oxide has a thickness of from 50 to 5000 angstrom.

17. A hologram member comprising a substrate, and a film provided peelably on said substrate, said film comprising a vinylcarbazole polymer in which a volume type phase hologram is recorded, wherein said substrate has a thickness of from 5-200 μm.

18. A hologram member of claim 17, wherein said substrate has a thickness of from 20 to 100 μm.

19. A hologram member comprising a substrate, and a film provided peelably on said substrate, said film comprising vinylcarbazole polymer in which a volume type phase hologram is recorded, wherein said substrate comprises a crystalline resin.

20. A hologram member comprising a substrate, and a film provided peelably on said substrate, said film comprising a vinylcarbazole polymer in which a volume type phase hologram is recorded, wherein said film is provided on said substrate with interposition of a peel layer.

21. A hologram member of claim 20, wherein said peel layer has no particular absorption band at a wavelength region of 400 to 800 nm.

22. A hologram member comprising a substrate, and a film provided peelably on said substrate, said film comprising a vinylcarbazole polymer in which a volume type phase hologram is recorded, wherein a layer for adhesion or sticking is provided on the surface of said film on the reverse side to the substrate side.

23. A hologram member comprising a substrate, and a film provided peelably on said substrate, said film comprising a vinylcarbazole polymer in which a volume type phase hologram is recorded, wherein a layer comprising one or more of a metal and a metal oxide is provided on the surface of said film on the reverse side to the substrate side.

24. The hologram member of claim 23, wherein said layer comprising one or more of a metal and a metal oxide has a thickness of from 50 to 5000 angstrom.

25. The hologram member according to claim 4, wherein said peel layer comprises a polymer layer having a surface tension sufficiently higher or sufficiently lower than the surface tension of the hologram film or a layer composed of a silane coupling agent or a titan coupling agent.

26. The hologram member according to claim 4, wherein the material constituting said peel layer is selected from the group of polyvinyl alcohol, polyvinylpyrrolidone, poly(ethylene-propylene) fluoride, poly(organic siloxane), gamma-glycidoxypropyltrimethoxysilane, vinyltrimethoxysilane, isopropyl tristearoyl titanate, and isopropyl trioctyl titanate.

27. The hologram member according to claim 12, wherein said peel layer comprises a polymer layer having a surface tension sufficiently higher or sufficiently lower than the surface tension of the hologram film or a layer composed of a silane coupling agent or a titan coupling agent.

28. The hologram member according to claim 12, wherein the material constituting said peel layer is selected from the group of polyvinyl alcohol, polyvinylpyrrolidone, poly(ethylene-propylene) fluoride, poly-(organic siloxane), gamma-glycidoxypropyltrimethoxysilane, vinyltrimethoxysilane, isopropyl tristearoyl titanate, and isopropyl trioctyl titanate.

29. The hologram member according to claim 20, wherein said peel layer comprises a polymer having a surface tension sufficiently higher or sufficiently lower than the surface tension of the hologram film or a layer composed of a silane coupling agent or a titan coupling agent.

30. The hologram member according to claim 20, wherein the material constituting said peel layer is selected from the group of polyvinyl alcohol, polyvinylpyrrolidone, poly(ethylene-propylene) fluoride, poly-(organic siloxane), gamma-glycidoxypropyltrimethoxysilane, vinyltrimethoxysilane, isopropyl tristearoyl titanate, and isopropyl trioctyl titanate.

31. The hologram member according to claim 6, wherein the material constituting said layer for adhesion or sticking is selected from the group of acrylic ester type polymers, vinyl acetate type polymers, alphacyanoacrylates, urethane type adhesives, rubber type adhesive, epoxy type adhesives.

32. The hologram member according to claim 14, wherein the material constituting said layer for adhesion or sticking is selected from the group of acrylic ester type polymers, vinyl acetate type polymers, alphacyanoacrylates, urethane type adhesives, rubber type adhesive, epoxy type adhesives.

33. The hologram member according to claim 22, wherein the material constituting said layer for adhesion or sticking is selected from the group of acrylic ester type polymers, vinyl acetate type polymers, alphacyanoacrylates, urethane type adhesives, rubber type adhesive, epoxy type adhesives.

34. The hologram member according to claim 7, wherein said metal or said metal oxide is selected from the group of InO, $Al_2O_3$, and Al.

35. The hologram member according to claim 15, wherein said metal or said metal oxide is selected from the group of InO, $Al_2O_3$, and Al.

36. The hologram member according to claim 23, wherein said metal or said metal oxide is selected from the group of InO, $Al_2O_3$, and Al.

* * * * *

UNITED STATES PATENT AND TRADEMARK OFFICE
CERTIFICATE OF CORRECTION

PATENT NO. : 4,908,285
DATED : March 13, 1990
INVENTOR(S) : NOBUO KUSHIBIKI, ET AL.

Page 1 of 3

It is certified that error appears in the above-identified patent and that said Letters Patent is hereby corrected as shown below:

ON TITLE PAGE:

IN [56] REFERENCES CITED

FOREIGN PATENT DOCUMENTS, "125823 2/1978 Japan" should read --125823 11/1978 Japan--.

COLUMN 1

Line 39, "high." should read --high;--.
    Line 48, "enduarable" should read --endurable--.
    Line 53, "type" should read --type in which--.
    Line 65, "uses expanding" should read --expanding uses--.

COLUMN 2

Line 16, "diagramatical" should read --diagrammatical--.
    Line 36, "the type" should read --the type in which--.
    Line 37, "mentioned, the" should read --mentioned, and the--.
    Line 41, "medium." should read --mediums.--.
    Line 47, "diagramatical" should read --diagrammatical--.

COLUMN 3

Line 39, "pxolyvinylidene cyani-" should read --polyvinylidene cyani- --.
    Line 51, "to take" should read --to make--.

UNITED STATES PATENT AND TRADEMARK OFFICE
CERTIFICATE OF CORRECTION

PATENT NO. : 4,908,285
DATED : March 13, 1990
INVENTOR(S) : NOBUO KUSHIBIKI, ET AL.

It is certified that error appears in the above-identified patent and that said Letters Patent is hereby corrected as shown below:

COLUMN 5

Line 16, "type" should read --type in which--.
Line 53, "extend" should read --extent--.
Line 67, "remain" should read --remains--.

COLUMN 7

Line 2, "sticked" should read --stuck--.
Line 17, "be" should read --is--.

COLUMN 8

Line 13, "apatial" should read --spatial-- and "20" should be deleted.
Line 54, "not" should read --no--.

COLUMN 9

Line 15, "obtained, it" should read --obtained--.
Line 38, "Polysole AB-412BN" should read --Polysol AB-412BN--.
Line 60, "space" should read --spatial--.

COLUMN 10

Line 31, "Polysole AB-412BN" should read --Polysol AB-412BN--.
Line 53, "the type" should read --the type in which--.
Line 54, "mentioned, the" should read --mentioned, and the--.

UNITED STATES PATENT AND TRADEMARK OFFICE
CERTIFICATE OF CORRECTION

PATENT NO. : 4,908,285
DATED : March 13, 1990
INVENTOR(S) : NOBUO KUSHIBIKI, ET AL.

It is certified that error appears in the above-identified patent and that said Letters Patent is hereby corrected as shown below:

COLUMN 12

Line 16, "A" should read --The--.

Signed and Sealed this

Thirteenth Day of August, 1991

Attest:

HARRY F. MANBECK, JR.

*Attesting Officer*  *Commissioner of Patents and Trademarks*